United States Patent
He et al.

(10) Patent No.: US 10,692,945 B2
(45) Date of Patent: Jun. 23, 2020

(54) MANUFACTURING METHOD FOR AN INKJET PRINTING AMOLED DISPLAY PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Kunpeng He, Guangdong (CN); Xiaoxing Zhang, Guangdong (CN)

(73) Assignee: SHENZHEN CHINA STAR OPTOELECTRONICS SEMICONDUCTOR DISPLAY TECHNOLOGY CO., LTD, Shenzhen, Guangdong (CN)

( * ) Notice: Subject to any disclaimer, the term of this patent is extended or adjusted under 35 U.S.C. 154(b) by 0 days.

(21) Appl. No.: 16/114,413

(22) Filed: Aug. 28, 2018

(65) Prior Publication Data

US 2019/0371871 A1    Dec. 5, 2019

Related U.S. Application Data

(63) Continuation of application No. PCT/CN2018/092356, filed on Jun. 22, 2018.

(30) Foreign Application Priority Data

May 29, 2018   (CN) .......................... 2018 1 0528668

(51) Int. Cl.
*H01L 27/32*    (2006.01)
*H01L 51/52*    (2006.01)
(Continued)

(52) U.S. Cl.
CPC ...... *H01L 27/3246* (2013.01); *H01L 27/1214* (2013.01); *H01L 51/0005* (2013.01); *H01L 51/5218* (2013.01)

(58) Field of Classification Search
CPC combination set(s) only.
See application file for complete search history.

(56) References Cited

U.S. PATENT DOCUMENTS

2008/0102643  A1*   5/2008   Chen ................... H01L 21/3081
                                                          438/710
2012/0292610  A1*  11/2012   Wang ................ H01L 29/42384
                                                          257/43
(Continued)

FOREIGN PATENT DOCUMENTS

CN         101044627 A      9/2007
CN         101855742 A     10/2010
(Continued)

*Primary Examiner* — Ratisha Mehta
(74) *Attorney, Agent, or Firm* — Leong C. Lei

(57) ABSTRACT

A manufacturing method for an inkjet printing AMOLED display panel is disclosed. The method includes steps of: manufacturing a TFT backplane, and manufacturing an anode on the TFT backplane; manufacturing a spacer layer for isolating the anode from a pixel definition layer on the anode; manufacturing a pixel definition layer on the TFT backplane, and the pixel definition layer covers the spacer layer; patterning the pixel definition layer to form a notch on the pixel definition layer in order to expose the spacer layer; etching the spacer layer below the notch by an etching solution; and forming an ink layer on the anode by an inkjet printing method. The invention can improve the cleanliness of the anode surface in the AMOLED display panel, reduce the residue, and make the printed light-emitting layer easier to spread evenly, prevent the AMOLED display panel from displaying abnormality.

20 Claims, 4 Drawing Sheets

(51) Int. Cl.
*H01L 27/12* (2006.01)
*H01L 51/00* (2006.01)

(56) References Cited

U.S. PATENT DOCUMENTS

| | | | | |
|---|---|---|---|---|
| 2014/0057379 | A1* | 2/2014 | Park | G03F 7/094 |
| | | | | 438/46 |
| 2017/0005294 | A1* | 1/2017 | Ahn | H01L 27/32 |
| 2019/0051712 | A1* | 2/2019 | Yu | H01L 27/3246 |

FOREIGN PATENT DOCUMENTS

| | | |
|---|---|---|
| CN | 105185815 A | 12/2015 |
| CN | 105914223 A | 8/2016 |

* cited by examiner

MANUFACTURING METHOD FOR AN INKJET PRINTING AMOLED DISPLAY PANEL

CROSS-REFERENCE TO RELATED APPLICATION

This application is a continuing application of PCT Patent Application No. PCT/CN2018/092356, entitled "manufacturing method for an inkjet printing AMOLED display panel", filed on Jun. 22, 2018, which claims priority to China Patent Application No. CN201810528668.1 filed on May 29, 2018, both of which are hereby incorporated in its entireties by reference.

FIELD OF THE INVENTION

The present invention relates to a display technology field, and in particular to a manufacturing method for an inkjet printing AMOLED display panel.

BACKGROUND OF THE INVENTION

In the vapor deposition technology of AMOLED (Active-matrix organic light emitting diode), the vapor deposition material has a uniform film thickness in the pixel region, and IJP-AMOLED (inkjet printing AMOLED) uses hydrophilic liquid ink to form a film. The residue of the hydrophobic PDL (Pixel Define Layer) material in the Bank region (pixel region) directly affects the spreading of the ink, resulting in abnormal pixel function and ultimately affecting the display effect. For example, as shown in FIG. 1, 1' is a TFT (Thin Film Transistor) backplane, 2' is a planarization layer, 3' is a pixel defining layer, and 4' is an anode. As shown in FIG. 2, 30' is a pixel defining layer after being patterned and having a notch 31' formed thereon, the anode 4' is exposed through the notch 31', and a pixel defining layer material 32' is remained on the anode 4'. As shown in FIG. 3, when the ink layer 5' is formed on the anode 4' by inkjet water (the ink material may be a material for illuminating), there is a blank region 41' around the remaining pixel defining layer material 32' without covering by the ink layer 5', which affects the display effect of the AMOLED.

Therefore, good ink spread ability greatly determines the product quality of the IJP-AMOLED, so it is especially important to clean the Bank region before printing ink. The PDL material is an organic photosensitive material, and the Bank region is formed by a yellow light and an OVEN process (baking process), and the PDL material residue in the pixel region after the PDL layer is developed directly affects the ink spread ability. Currently, the PDL material residue for vapor deposition of the AMOLED pixel region is often subjected to a dry etching process after the PDL yellow light process. However, the use of the dry etching process after the PDL yellow light process of IJP-AMOLED brings the following problems:

1. The dry etching destroys the surface structure of PDL, which makes the PDL lose its hydrophobicity. Therefore, the ink dropped in the IJP process tends to adhere to the surface of the Bank region instead of flowing into the Bank region.

2. The dry etching causes a certain degree of loss of the thickness and line width of the PDL, affecting the confirmation of the ink drop amount and the aperture ratio of the pixel.

SUMMARY OF THE INVENTION

In order to solve the above technical problem, the present invention provides a manufacturing method for an inkjet printing AMOLED display panel, which can improve the cleanliness of the anode surface in the AMOLED display panel, reduce the residue, and make the printed light-emitting layer easier to spread evenly, so as to avoid the abnormality of the AMOLED display panel display, and will not destroy the surface structure of the pixel definition layer, nor cause loss of the surface thickness and line width of the pixel definition layer.

The present invention provides a manufacturing method for an inkjet printing AMOLED display panel, comprising steps of: manufacturing a TFT backplane, and manufacturing an anode on the TFT backplane; manufacturing a spacer layer for isolating the anode from a pixel definition layer on the anode; manufacturing a pixel definition layer on the TFT backplane, and the pixel definition layer covers the spacer layer; patterning the pixel definition layer to form a notch on the pixel definition layer in order to expose the spacer layer; etching the spacer layer below the notch by an etching solution; and forming an ink layer on the anode by an inkjet printing method.

Preferably, a thickness of the spacer layer ranges from 300 to 800 angstroms.

Preferably, the spacer layer is a metal film layer, and the anode is a transparent electrode or a reflective electrode.

Preferably, the transparent electrode is a layer of ITO film, and the reflective electrode includes two layers of ITO film and a silver metal layer sandwiched between the two layers of ITO film.

Preferably, after patterning the pixel definition layer, the method further includes following steps; performing a baking process to the pixel defining layer after being patterned and the anode.

Preferably, the spacer layer is a molybdenum film layer or an aluminum film layer, and through an aluminum etching solution, etching the spacer layer below the notch of the pixel definition layer.

Preferably, through a yellow light process for patterning the pixel definition layer.

Preferably, the pixel definition layer is a hydrophobic pixel definition layer.

Preferably, the method further comprises a step of: manufacturing a planarization layer on the TFT backplane, and the pixel definition layer and the anode are both located on the planarization layer.

Preferably, the step of forming an ink layer on the anode by an inkjet printing method specifically includes: sequentially forming a hole layer and a light-emitting layer on the anode by an inkjet printing method, wherein the hole layer includes a hole-injection layer and a hole-transport layer, and the hole-transport layer is located between the hole-injection layer and the light-emitting layer.

The present invention also provides a manufacturing method for an inkjet printing AMOLED display panel, comprising steps of: manufacturing a TFT backplane, and manufacturing an anode on the TFT backplane; manufacturing a spacer layer for isolating the anode from a pixel definition layer on the anode; manufacturing a pixel definition layer on the TFT backplane, and the pixel definition layer covers the spacer layer; patterning the pixel definition layer to form a notch on the pixel definition layer in order to expose the spacer layer; etching the spacer layer below the notch by an etching solution; and forming an ink layer on the anode by an inkjet printing method; wherein a thickness of the spacer layer ranges from 300 to 800 angstroms; and wherein the spacer layer is a metal film layer, and the anode is a transparent electrode or a reflective electrode.

Preferably, the transparent electrode is a layer of ITO film, and the reflective electrode includes two layers of ITO film and a silver metal layer sandwiched between the two layers of ITO film.

Preferably, after patterning the pixel definition layer, the method further includes following steps: performing a baking process to the pixel defining layer after being patterned and the anode.

Preferably, the spacer layer is a molybdenum film layer or an aluminum film layer, and through an aluminum etching solution, etching the spacer layer below the notch of the pixel definition layer.

Preferably, through a yellow light process for patterning the pixel definition layer; and wherein the pixel definition layer is a hydrophobic pixel definition layer.

Preferably, the method further comprises a step of: manufacturing a planarization layer on the TFT backplane, and the pixel definition layer and the anode are both located on the planarization layer; wherein the step of forming an ink layer on the anode by an inkjet printing method specifically includes: sequentially forming a hole layer and a light-emitting layer on the anode by an inkjet printing method, wherein the hole layer includes a hole-injection layer and a hole-transport layer, and the hole-transport layer is located between the hole-injection layer and the light-emitting layer.

The present invention also provides a manufacturing method for an inkjet printing AMOLED display panel, comprising steps of: manufacturing a TFT backplane, and manufacturing an anode on the TFT backplane; manufacturing a spacer layer for isolating the anode from a pixel definition layer on the anode; manufacturing a pixel definition layer on the TFT backplane, and the pixel definition layer covers the spacer layer; patterning the pixel definition layer to form a notch on the pixel definition layer in order to expose the spacer layer; etching the spacer layer below the notch by an etching solution; and forming an ink layer on the anode by an inkjet printing method; wherein the step of forming an ink layer on the anode by an inkjet printing method specifically includes: sequentially forming a hole layer and a light-emitting layer on the anode by an inkjet printing method, wherein the hole layer includes a hole-injection layer and a hole-transport layer, and the hole-transport layer is located between the hole-injection layer and the light-emitting layer.

Preferably, a thickness of the spacer layer ranges from 300 to 800 angstroms;

Preferably, the spacer layer is a metal film layer, and the anode is a transparent electrode or a reflective electrode.

Preferably, the transparent electrode is a layer of ITO film, and the reflective electrode includes two layers of ITO film and a silver metal layer sandwiched between the two layers of ITO film; wherein after patterning the pixel definition layer, the method further includes following steps: performing a baking process to the pixel defining layer after being patterned and the anode; wherein the spacer layer is a molybdenum film layer or an aluminum film layer, and through an aluminum etching solution, etching the spacer layer below the notch of the pixel definition layer.

Preferably, through a yellow light process for patterning the pixel definition layer; wherein the manufacturing method for an inkjet printing AMOLED display panel further comprises a step of: manufacturing a planarization layer on the TFT backplane, and the pixel definition layer and the anode are both located on the planarization layer.

The present invention has the following beneficial effects: the present invention prepares a spacer layer on the surface of the anode on the TFT backplane, and etching the pixel definition layer above the spacer layer, that is, there is a residual material of the pixel definition layer on the surface of the spacer layer. The spacer layer is etched away by the etching solution, thereby removing the residual material of pixel definition layer material the surface of the spacer layer, thereby improving the cleanliness of the anode surface and reducing the residue, so that the printed light-emitting layer is more easily to spread evenly, so as to avoid a display abnormal of the AMOLED. Moreover, the present invention does not increase the dry etching process, which will not destroy the surface structure of the pixel definition layer, and will not cause loss of the surface thickness and line width of the pixel definition layer.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF PREFERRED EMBODIMENTS

Figure 1:
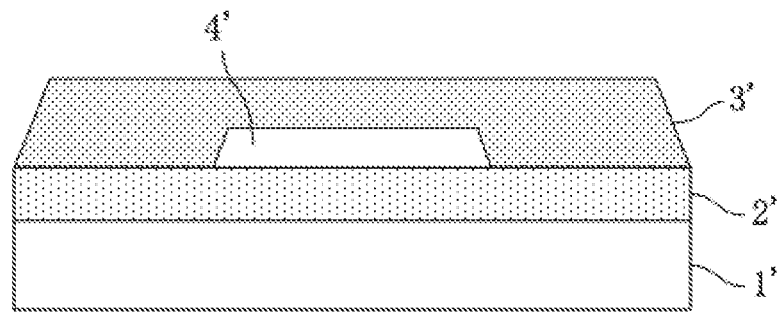
FIG. 1 is a schematic diagram of an anode and a pixel definition layer manufactured on a TFT backplane in the prior art.
Figure 2:
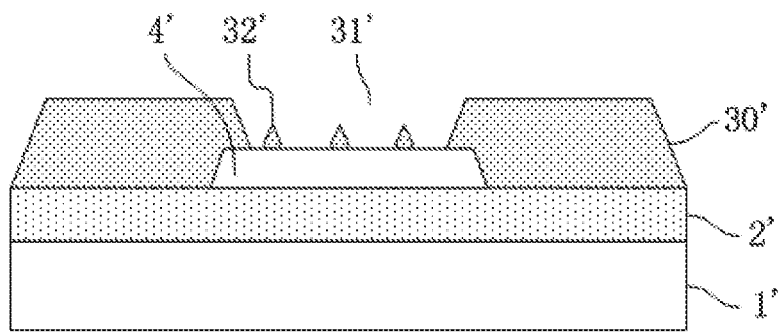
FIG. 2 is a schematic diagram of a pixel definition layer in FIG. 1.
Figure 3:
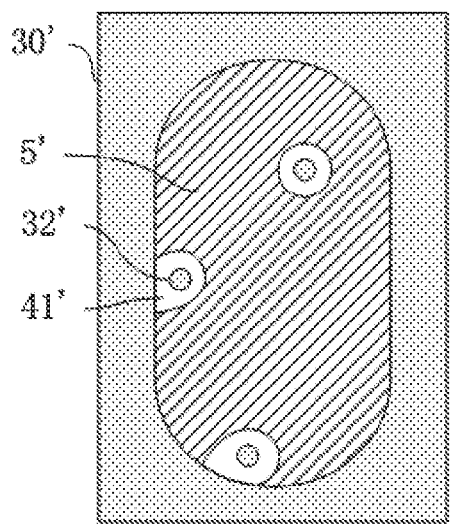
FIG. 3 is a schematic diagram of the manufacturing an ink layer on the anode of FIG. 2.
Figure 4:
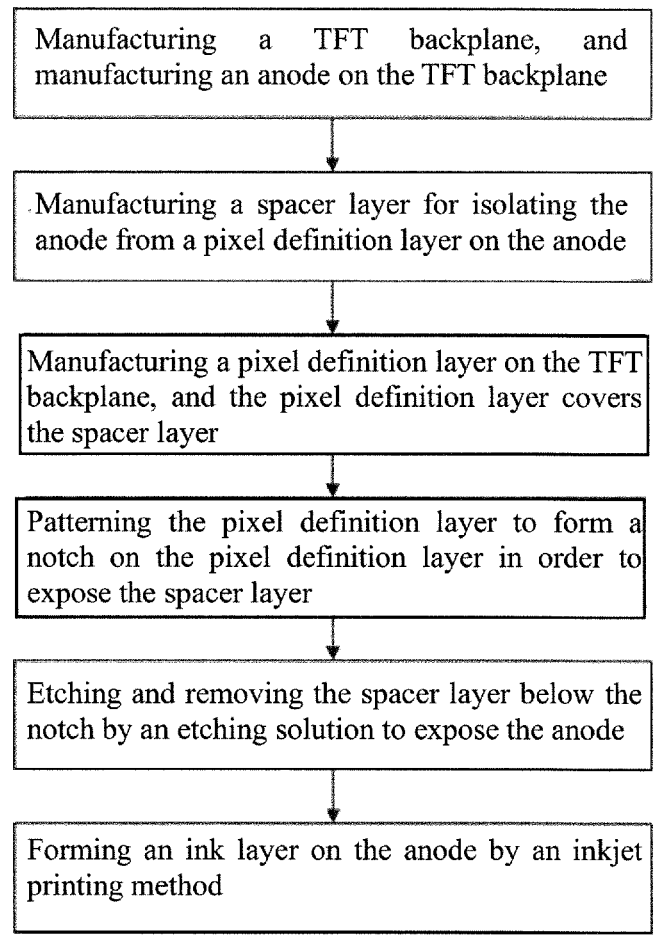
FIG. 4 is a flow chart of a manufacturing method for an inkjet printing AMOLED display panel according to the present invention.
Figure 5:
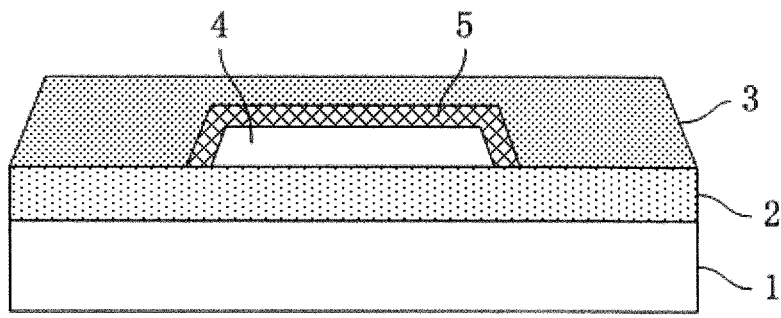
FIG. 5 is a schematic diagram of an anode, a spacer layer, and a pixel definition layer prepared on a TFT backplane provided by the present invention.

The invention provides a manufacturing method for an inkjet printing AMOLED display panel. As shown in FIG. 4, the manufacturing method includes following steps:

Referring to FIG. 5, manufacturing a TFT (Thin Film Transistor) backplane 1, and manufacturing an anode 4 on the TFT backplane 1.

manufacturing a spacer layer 5 for isolating the anode 4 from a pixel definition layer on the anode 4.

manufacturing a pixel definition layer 3 on the TFT backplane 1, and the pixel definition layer 3 covers the spacer layer 5.

Figure 6:
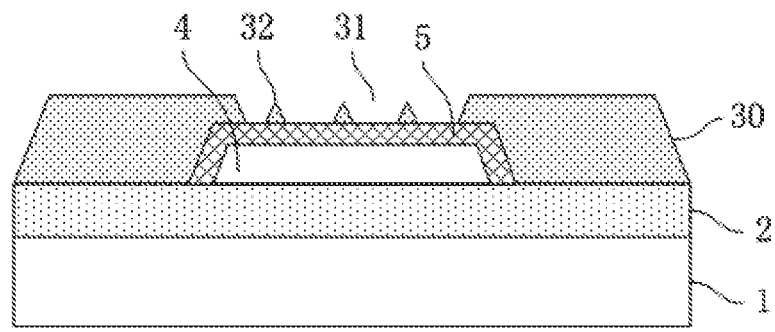
FIG. 6 is a schematic structural diagram of the pixel definition layer in FIG. 5 provided by the present invention.

As shown in FIG. 6, patterning the pixel definition layer 3 to form a notch 31 on the pixel definition layer 3 in order to expose the spacer layer 5. The element 30 in FIG. 6 is the pixel definition layer 3 after being patterned.

Figure 7:
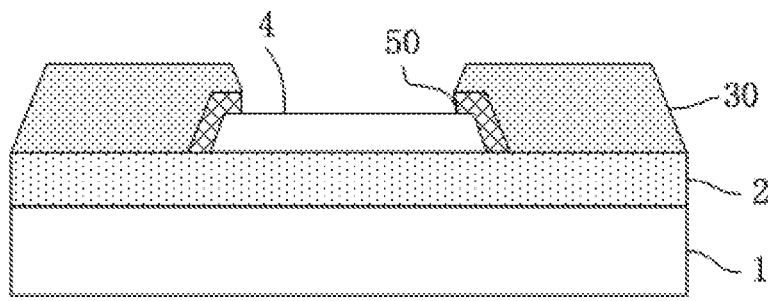
FIG. 7 is a schematic diagram showing the structure obtained by etching the spacer layer below the notch of the pixel definition layer in FIG. 6 according to the present invention.

As shown in FIG. 7, etching and removing the spacer layer 5 below the notch 31 by an etching solution, and removing a residual pixel definition layer material 32 on the spacer layer 5 to expose the anode 4; a surface of the anode 4 is flat and has no the residual pixel definition layer material 32 or other residue is remained. The numeral 50 shown in FIG. 7 shows that after etching the spacer layer 5 below the notch 31, and the anode 4 is exposed.

Figure 8:
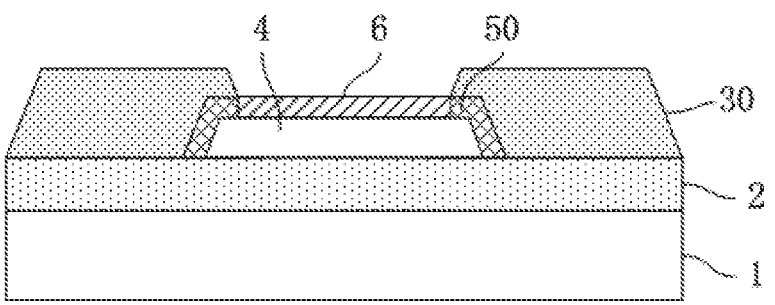
FIG. 8 is a cross-sectional view showing the preparation of an ink layer on the anode of FIG. 7 provided by the present invention.
Figure 9:
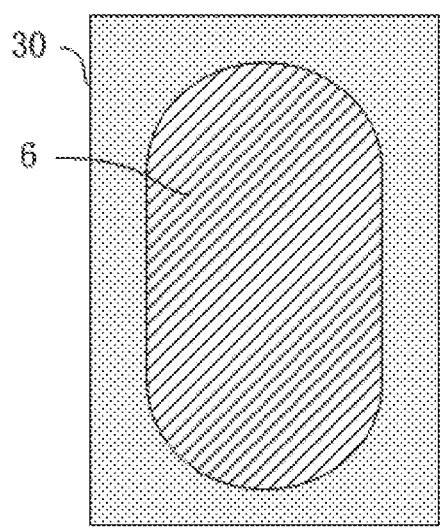
FIG. 9 is a top plan view of the ink layer prepared on the anode of FIG. 7 provided by the present invention.

As shown in FIG. 8, forming an ink layer 6 for light emission on the anode 4 by an inkjet printing method. As shown FIG. 9, the ink layer 6 spreads well on the surface of the anode 4, and the ink layer 6 can be spread evenly on the surface of the anode 4, thereby improving the display effect of the AMOLED display panel.

In the present invention, after the pixel definition layer is patterned, a dry etching process is not necessary, so that the surface structure of the pixel definition layer is not destroyed, and the thickness and line width of the pixel definition layer are not lost.

Furthermore, a thickness of the spacer layer 5 ranges from 300 to 800 angstroms.

Furthermore, the spacer layer 5 is a metal film layer, and the anode 4 is a transparent electrode or a reflective electrode.

Figure 10:
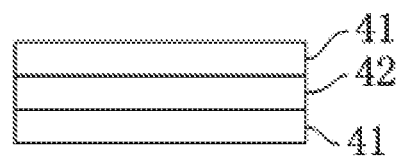
FIG. 10 is a schematic structural diagram of an anode according to an embodiment of the present invention.

In one embodiment, as shown in FIG. 10, the reflective electrode includes two layers of ITO film 41 and a silver metal layer 42 sandwiched between the two layers of ITO film 41. In another embodiment, the transparent electrode is a layer of ITO (Indium Tin Oxide) film.

The AMOLED display panel of the present invention may be a top-emitting type or a bottom-emitting type. When the AMOLED display panel is the top-emitting type, an emitted light of the AMOLED display panel is transmitted from the cathode opposite to the anode, and the anode is the reflective electrode and the cathode is a transparent electrode. When the AMOLED display panel is the bottom-emitting type, an emitted light of the AMOLED display panel is transmitted from the anode, and the anode is a transparent electrode and the cathode is a reflective electrode.

Furthermore, after patterning the pixel definition layer 3, the method further includes following steps:

performing a baking process to the pixel defining layer 30 after being patterned and the anode 4, and the pixel definition layer can be cured by the baking process, and an amorphous ITO film layer in the anode 4 can also be converted into a crystalline ITO film.

Furthermore, the spacer layer 5 is a molybdenum film layer or an aluminum film layer, and through an aluminum etching solution, etching the spacer layer 5 below the notch 31 of the pixel definition layer.

Furthermore, through a yellow light process for patterning the pixel definition layer 3 shown in FIG. 5. In general, the yellow light process involves coating a photoresist on the pixel definition layer, exposing, developing, and etching the pixel definition layer.

Furthermore, the pixel definition layer is a hydrophobic pixel definition layer.

Furthermore, the manufacturing method for an inkjet printing AMOLED display panel further includes the following steps:

manufacturing a planarization layer 2 on the TFT backplane 1, and the pixel definition layer 3 and the anode 4 are both located on the planarization layer 2.

Figure 11:
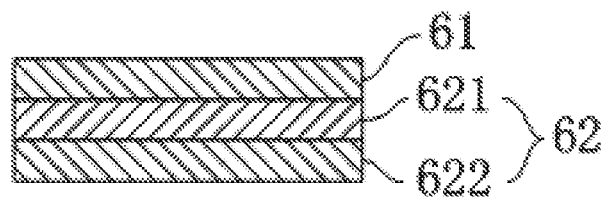
FIG. 11 is a schematic diagram showing the structure of an ink layer provided by the present invention.

Furthermore, the step of forming an ink layer 5 on the anode 4 by an inkjet printing method specifically includes:

sequentially forming a hole layer 62 and a light-emitting layer 61 shown in FIG. 11 on the anode 4 by an inkjet printing method; wherein the hole layer 62 includes a hole-injection layer 622 and a hole-transport layer 621, and the hole-transport layer 621 is located between the hole-injection layer 622 and the light-emitting layer 61.

Preferably, the active layer of the thin film transistor on the TFT backplane 1 may be an oxide material such as a low temperature polysilicon material or an IGZO (indium gallium zinc oxide), or may be another semiconductor material.

In summary, in the ink-jet printing AMOLED display panel provided by the present invention, after the anode of the TFT backplane is fabricated, a spacer layer forming process, a yellow light process, and an etching process are added, and then the yellow light process and the baking process for the pixel definition layer is performed. Finally, etching the spacer layer with an aluminum etching solution.

Since the etching rate of the aluminum etching solution to the spacer layer can reach 400-500 Å/s, the spacer layer of a certain thickness can be etched cleanly in a short time, and the anisotropy of the wet etching also ensures that a small amount of the pixel defining layer material remaining on the surface of the spacer layer does not cause the etching of the spacer layer to be unclean.

The amorphous ITO film layer also forms a crystalline ITO film layer in the baking process of the pixel defining layer, and the aluminum etching solution does not react with the crystalline ITO film layer. Therefore, the present invention can ensure that the spacer layer is etched away and the residual pixel definition layer material is removed without affecting the anode film layer.

The invention can improve the cleanliness of the surface of the anode film layer in the AMOLED display panel and reduce the residue, so that the printed light-emitting layer is more easily to spread evenly, so as to prevent the AMOLED display panel from displaying abnormality.

Moreover, the film forming process, the yellow light process, and the etching process of the spacer layer are all common processes, and there is no special requirement for equipment and materials, so the invention can greatly improve the product yield with a small increase in cost.

The above is a further detailed description of the present invention in connection with the specific preferred embodiments, and the specific embodiments of the present invention are not limited to the description. For those skilled in the art to which the present invention pertains, a number of simple derivations or substitutions may be made without departing from the inventive concept, and should be considered as the protection scope of the present invention.

What is claimed is:

1. A manufacturing method for an inkjet printing active-matrix organic light emitting diode (AMOLED) display panel, comprising steps of:

manufacturing a thin-film transistor (TFT) backplane, and manufacturing an anode on the TFT backplane;

manufacturing a spacer layer covering the anode;

manufacturing a pixel definition layer on the TFT backplane, wherein the pixel definition layer covers the spacer layer and the spacer layer isolates the anode from the pixel definition layer;

patterning the pixel definition layer to form a notch in order to expose the spacer layer;

etching the spacer layer below the notch by an etching solution; and forming an ink layer on the anode by an inkjet printing method,
wherein the spacer layer is a metal film layer that is of a single-layered structure and the etching solution is applied to etch through the single-layered structure of the metal film layer to expose the anode.

2. The manufacturing method for an inkjet printing AMOLED display panel according to claim 1, wherein a thickness of the spacer layer ranges from 300 to 800 angstroms.

3. The manufacturing method for an inkjet printing AMOLED display panel according to claim 1, wherein the anode is a transparent electrode or a reflective electrode.

4. The manufacturing method for an inkjet printing AMOLED display panel according to claim 3, wherein the transparent electrode is a layer of ITO film, and the reflective electrode includes two layers of ITO film and a silver metal layer sandwiched between the two layers of ITO film.

5. The manufacturing method for an inkjet printing AMOLED display panel according to claim 4, wherein after patterning the pixel definition layer, the method further includes following steps:
performing a baking process to the pixel defining layer after being patterned and the anode.

6. The manufacturing method for an inkjet printing AMOLED display panel according to claim 5, wherein the spacer layer is a molybdenum film layer or an aluminum film layer, and through an aluminum etching solution, etching the spacer layer below the notch of the pixel definition layer.

7. The manufacturing method for an inkjet printing AMOLED display panel according to claim 1, wherein through a yellow light process for patterning the pixel definition layer.

8. The manufacturing method for an inkjet printing AMOLED display panel according to claim 1, wherein the pixel definition layer is a hydrophobic pixel definition layer.

9. The manufacturing method for an inkjet printing AMOLED display panel according to claim 1, wherein the method further comprises a step of:
manufacturing a planarization layer on the TFT backplane, and the pixel definition layer and the anode are both located on the planarization layer.

10. The manufacturing method for an inkjet printing AMOLED display panel according to claim 1, wherein the step of forming an ink layer on the anode by an inkjet printing method specifically includes:
sequentially forming a hole layer and a light-emitting layer on the anode by an inkjet printing method, wherein the hole layer includes a hole-injection layer and a hole-transport layer, and the hole-transport layer is located between the hole-injection layer and the light-emitting layer.

11. A manufacturing method for an inkjet printing active matrix organic light emitting diode (AMOLED) display panel comprising steps of:
manufacturing a thin-film transistor (TFT) backplane and manufacturing an anode on the TFT backplane;
manufacturing a spacer layer covering the anode;
manufacturing a pixel definition layer of the TFT backplane, wherein the pixel definition layer covers the spacer layer and the spacer layer isolates the anode from the pixel definition layer;
patterning the pixel definition layer to form a notch in order to expose the spacer layer;
etching the spacer layer below the notch by an etching solution; and
forming an ink layer on the anode by an inkjet printing method;
wherein a thickness of the spacer layer ranges from 300 to 800 angstroms; and
wherein the spacer layer is a metal film that is of a single-layered structure and the etching solution is applied to etch through the single-layered structure of the metal film layer to expose the anode and the anode is a transparent electrode or a reflective electrode.

12. The manufacturing method for an inkjet printing AMOLED display panel according to claim 11, wherein the transparent electrode is a layer of ITO film, and the reflective electrode includes two layers of ITO film and a silver metal layer sandwiched between the two layers of ITO film.

13. The manufacturing method for an inkjet printing AMOLED display panel according to claim 12, wherein after patterning the pixel definition layer, the method further includes following steps:
performing a baking process to the pixel defining layer after being patterned and the anode.

14. The manufacturing method for an inkjet printing AMOLED display panel according to claim 13, wherein the spacer layer is a molybdenum film layer or an aluminum film layer, and through an aluminum etching solution, etching the spacer layer below the notch of the pixel definition layer.

15. The manufacturing method for an inkjet printing AMOLED display panel according to claim 11, wherein through a yellow light process for patterning the pixel definition layer; and
wherein the pixel definition layer is a hydrophobic pixel definition layer.

16. The manufacturing method for an inkjet printing AMOLED display panel according to claim 11, wherein the method further comprises a step of:
manufacturing a planarization layer on the TFT backplane, and the pixel definition layer and the anode are both located on the planarization layer;
wherein the step of forming an ink layer on the anode by an inkjet printing method specifically includes: sequentially forming a hole layer and a light-emitting layer on the anode by an inkjet printing method, wherein the hole layer includes a hole-injection layer and a hole-transport layer, and the hole-transport layer is located between the hole-injection layer and the light-emitting layer.

17. A manufacturing method for an inkjet printing active matrix organic light emitting diode (AMOLED) display panel comprising steps of:
manufacturing a thin-film transistor (TFT) backplane and manufacturing an anode on the TFT backplane;
manufacturing a spacer layer covering the anode;
manufacturing a pixel definition layer on the TFT backplane, and the pixel definition layer covers the spacer layer and the spacer layer isolates the anode from the pixel definition layer;
patterning the pixel definition layer to form a notch in order to expose the spacer layer;
etching the spacer layer below the notch by an etching solution; and
forming an ink layer on the anode by an inkjet printing method;
wherein the spacer layer is a metal film that is of a single-layered structure and the etching solution is applied to etch through the single-layered structure of the metal film layer to expose the anode; and
wherein the step of forming an ink layer on the anode by an inkjet printing method specifically includes: sequentially forming a hole layer and a light-emitting layer on the anode by an inkjet printing method, wherein the hole layer includes a hole-injection layer and a hole transport layer, and the hole-transport layer is located between the hole-injection layer and the light-emitting layer.

18. The manufacturing method for an inkjet printing AMOLED display panel according to claim 17, wherein a thickness of the spacer layer ranges from 300 to 800 angstroms;
  wherein the anode is a transparent electrode or a reflective electrode.

19. The manufacturing method for an inkjet printing AMOLED display panel according to claim 18, wherein the transparent electrode is a layer of ITO film, and the reflective electrode includes two layers of ITO film and a silver metal layer sandwiched between the two layers of ITO film;
  wherein after patterning the pixel definition layer, the method further includes following steps:
  performing a baking process to the pixel defining layer after being patterned and the anode;
  wherein the spacer layer is a molybdenum film layer or an aluminum film layer, and through an aluminum etching solution, etching the spacer layer below the notch of the pixel definition layer.

20. The manufacturing method for an inkjet printing AMOLED display panel according to claim 17, wherein through a yellow light process for patterning the pixel definition layer;
  wherein the manufacturing method for an inkjet printing AMOLED display panel further comprises a step of:
  manufacturing a planarization layer on the TFT backplane, and the pixel definition layer and the anode are both located on the planarization layer.

* * * * *